(12) United States Patent
Cussonneau et al.

(10) Patent No.: US 7,941,722 B2
(45) Date of Patent: May 10, 2011

(54) TESTING OF INTEGRATED CIRCUITS USING TEST MODULE

(75) Inventors: Pascal Cussonneau, Antibes (FR); Eric Bernillon, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 372 days.

(21) Appl. No.: 12/136,035

(22) Filed: Jun. 9, 2008

(65) Prior Publication Data
US 2008/0320347 A1 Dec. 25, 2008

Related U.S. Application Data

(60) Provisional application No. 60/945,946, filed on Jun. 24, 2007.

(51) Int. Cl.
*G06F 11/00* (2006.01)
(52) U.S. Cl. ........................................ 714/742; 714/744
(58) Field of Classification Search .................. 714/724, 714/726, 731, 732, 736, 741, 744, 742; 716/4; 324/765
See application file for complete search history.

(56) References Cited

U.S. PATENT DOCUMENTS

| | | | |
|---|---|---|---|
| 5,640,509 A * | 6/1997 | Balmer et al. .................. | 714/42 |
| 6,223,312 B1 * | 4/2001 | Nozuyama .................... | 714/724 |
| 6,442,722 B1 * | 8/2002 | Nadeau-Dostie et al. .... | 714/731 |
| 6,684,358 B1 * | 1/2004 | Rajski et al. .................. | 714/739 |
| 7,475,313 B2 * | 1/2009 | Damodaran et al. .......... | 714/733 |
| 7,509,551 B2 * | 3/2009 | Koenemann et al. ......... | 714/732 |
| 2008/0263421 A1 * | 10/2008 | Goessel et al. ................ | 714/732 |

OTHER PUBLICATIONS

Bhavsar, D.; , "A method for synchronizing IEEE 1149.1 test access port for chip level testability access," VLSI Design, 1998. Proceedings., 1998 Eleventh International Conference on , vol., No., pp. 289-292, Jan. 4-7, 1998 doi: 10.1109/ICVD.1998.646620.*
Wohl, P.; Waicukauski, J.A.; Williams, T.W.; , "Design of compactors for signature-analyzers in built-in self-test ," Test Conference, 2001. Proceedings. International , vol., No., pp. 54-63, 2001 doi: 10.1109/TEST.2001.966618.*

* cited by examiner

*Primary Examiner* — Cynthia Britt
(74) *Attorney, Agent, or Firm* — Ronald O. Neeringe; Wade James Brady, III; Frederick J. Telecky, Jr.

(57) ABSTRACT

A method and apparatus for testing of integrated circuits using a Direct Memory Load Execute Dump (DMLED) test module. The method includes loading a test case into a memory using the DMLED test module, loading initialization signatures of fixed pattern into the memory using the DMLED test module, and executing the test case at an operating clock rate of a processor. The method further includes writing result signatures into the memory, and dumping the results signatures from the memory to a tester using the DMLED test module.

22 Claims, 9 Drawing Sheets

TESTING OF INTEGRATED CIRCUITS USING TEST MODULE

This application claims priority under 35 USC §119(e)(1) of Provisional Application No. 60/945,946, filed Jun. 24, 2007.

FIELD OF THE INVENTION

The present invention generally relates to testing of integrated circuits. More particularly, the invention relates to functional testing of integrated circuits at real-time clock speeds. Still more particularly, the invention relates to the use of a test module for functional testing of integrated circuits at real-time clock speeds.

BACKGROUND OF THE INVENTION

Automatic Test Pattern Generator (ATPG) is a design tool that simulates and tests the functionality of individual circuits within an integrated circuit. ATPG generates test vectors for structural testing of the overall functionality of the individual circuits within the integrated circuit. Through the use of real-time clock speed test vectors generated by ATPG, Automatic Testing Equipment (ATE) may provide a particular degree of fault coverage and simulation for the circuitry. ATPG may generate test vectors that detects stuck-at faults, transition faults, path delay faults and other types of faults in circuitry. Conventionally, these test vectors are provided in a computer readable file to the ATE or other testers. The ATE is used in a manufacturing environment to test the die at wafer sort, in packaged tests, and from customer returns. During wafer-level testing of a die, test signals are provided through input or input/output (I/O) bond pads on the die, and the test results are monitored on output or I/O bond pads.

Testing of digital systems, such as the core logic of an integrated circuit, is typically performed by loading a test pattern or stimulus into scanable memory elements in the system, launching the test data into the system, operating the system in normal mode for one or more clock cycles of the system clock, capturing the response of the system to the test stimulus, unloading the test response from the system and then comparing the response to the response which should have been obtained if the system was operating according to design.

To improve test coverage of individual circuits, Design for Testability (DFT) tools have been developed to embed test circuitry into the System-on-Chip (SoC). For example, Built-In Self-Test (BIST) circuitry may be embedded in the integrated circuit design to test individual circuit blocks. BIST circuitry is particularly useful for testing circuit blocks that are not readily accessible through the bond pads of the device under test (DUT). Automated DFT tools may generate BIST circuitry such as memory BIST (MBIST) for testing memory blocks and logic BIST for testing logic blocks. External I/Os directly receive the results of tests conducted by BIST circuitry. In the alternative, external I/Os receive these results indirectly through boundary scan circuitry embedded in the design. Additional internal embedded test circuitry such as scan chain circuitry may also be added to the design to increase the internal testability of internal designs.

Separate embedded test circuitry requires input and output ports that are separate from the input and output ports of the programmed functions. During normal operations, the functional circuitry operates. In the alternative, during the testing mode of operations, a separate set of test circuitry using test inputs and outputs are used. Each core and sub-core embedded on a SoC includes its own test input and output ports and needs to be tested individually, without interference from adjacent cores. Wrapper cell is the circuitry attached to the functional elements of a core to provide paths for test data to flow. The test ports are part of the wrapper cell. Wrapper cell generally includes a flip-flop and a multiplexer, and is able to function in a functional mode and a test mode. In the functional mode, the wrapper cell is transparent and normal functional signals are passed through the multiplexer to the functional core. In the test mode, the wrapper cell changes the input signal causing the test input to be passed through the multiplexer.

Difficulties arise in at-speed testing of systems having multiple clock domains when the clock sources differ from the test clock signal used to perform the test, when these domains have different clock frequencies, and/or when signals crossing the boundary between these clock domains have different clock frequencies. More particularly, it is not uncommon for a SOC integrated circuit (IC) to include several digital modules having a variety of clocking domains and clock frequencies. Since the elements in one domain operate at a different frequency from that of other domains in the system, special provisions must be made during testing to ensure that signals traversing clock domains are synchronized. Synchronization of signals traversing clock domains may be performed by ad hoc clock shaping techniques on some complex SOCs. If signals traversing clock domains are not synchronized, the test response from the system may not be repeatable and test results will be unreliable.

Problems described above of ATPG and BIST based testing techniques may result in need for a testing method and circuitry that enables testing of digital systems at operational clock rate of the system. Such a testing method and circuitry should eliminate problems resulting from multiple clock domains and cover functionality of the SOC device under test (DUT) that is not covered by the ATPG or BIST tests. Furthermore, the testing method and circuitry should also add increased coverage of otherwise unknown and untestable circuitry during production life of the SOC DUT integrated circuit that was not in the original ATPG or BIST design-for-test coverage.

SUMMARY OF THE INVENTION

In one aspect, a method of testing integrated circuits includes but is not limited to loading a test case from a tester into a memory using a test module; loading initialization signatures from the tester into the memory using the test module; executing the test case, wherein the test case is executed by a processor; writing result signatures into the memory; and dumping the result signatures using the test module from the memory to the tester.

In one aspect, an article comprising a medium storing instructions that, if executed, enable a processor-based system to test integrated circuits by: loading a test case from a tester into a memory using a test module; loading initialization signatures from the tester into the memory using the test module; executing the test case, wherein the test case is executed by a processor; writing result signatures into the memory; and dumping the result signatures using the test module from the memory to the tester.

In one aspect, an apparatus for testing integrated circuits includes but is not limited to a test module; a memory operably coupled to the test module; a tester operably coupled to the test module, said test module loading a test case and initialization signatures from the tester into the memory; a processor operably coupled to the memory, said processor executing the test case and writing result signatures into the memory, wherein the test module dumps the result signatures from the memory to the tester.

In one aspect, an apparatus for testing integrated circuits includes but is not limited to a test module; a first memory operably coupled to the test module; a programmable Built-In-Self-Test (PBIST) module operably coupled to the first memory; one or more memories-under-test (MUT) operably coupled to the PBIST module; and a tester operably coupled to the test module, said test module loading a test case and initialization signatures from the tester into the first memory to test the one or more MUTs, said PBIST module executing the test case and writing result signatures into the first memory, wherein the test module dumps the result signatures from the first memory to the tester.

In addition to the foregoing, various other method, device, and system aspects are set forth and described in the teachings, such as the text (e.g., claims or detailed description) or drawings, of the present disclosure.

The foregoing is a summary and thus contains, by necessity, simplifications, generalizations and omissions of detail; consequently, those skilled in the art will appreciate that the summary is illustrative only and is not intended to be in any way limiting. Other aspects, features, and advantages of the devices, processes, or other subject matter described herein will become apparent in the teachings set forth herein.

BRIEF DESCRIPTION OF THE DRAWINGS

The embodiments of the invention will now be described with reference to the accompanying drawings in which.

NOTATION AND NOMENCLATURE

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION OF PREFERRED EMBODIMENTS

Figure 1:
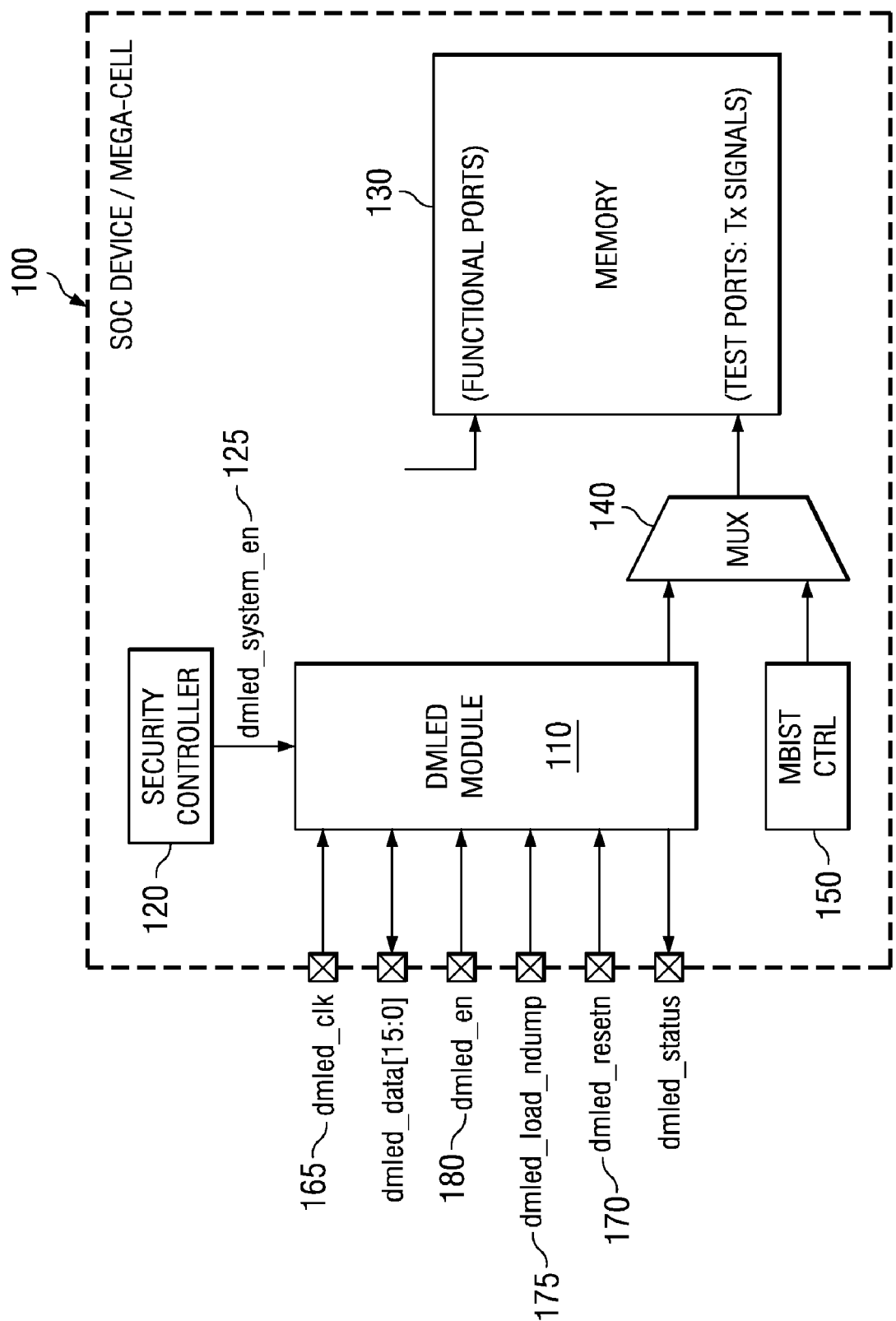
FIG. 1 shows a die containing Direct Memory Load Execute Dump (DMLED) test module, memory, and MBIST controller in accordance with some preferred embodiments of the invention.

Referring to FIG. 1, a wafer includes many dice System-on-Chips (SOCs) that may also embed megacells. The die includes a test module 110 that may be a Direct Memory Load Execute Dump (DMLED) module. The DMLED test module 110 includes a number of input/output (I/O) pins including: dmled_clk 165 that may be a clock input to the DMLED test module; dmled_data input/output signal that in some embodiments is shown as a 16 bit data bus in FIG. 1 but may be any $2^n$ size bus; DMLED test module enable input signal dmled_en 180; input signal dmled_load_ndump 175 that enables DMLED test module to load or dump data to/from memory 130 and Very Low Cost Tester (VLCT, not shown in FIG. 1); input signal dmled_resetn 170 that may be a reset signal for the DMLED test module; and output signal dmled_status that indicates status of DMLED test module 110. I/O pins of DMLED test module 110 will be described in more detail below with reference to load, execute, and dump phase. In accordance with some embodiments of the invention, the DMLED test module 110 also includes a state machine (shown in FIG. 10) that translates the data from the VLCT to memory 130 that may be Random Access Memory (RAM) through multiplexer 140. A memory Built-In-Self-Test (MBIST) controller 150 also connects through multiplexer 140 to memory 130. As shown in FIG. 1, security enable signal dmled_system_en 125 from Security controller 120 couples to DMLED test module 110 and prevents improper access to the contents of memory 130. Security enable signal dmled_system_en 125 and Security controller 120 will be described in more detail below.

Figure 10:
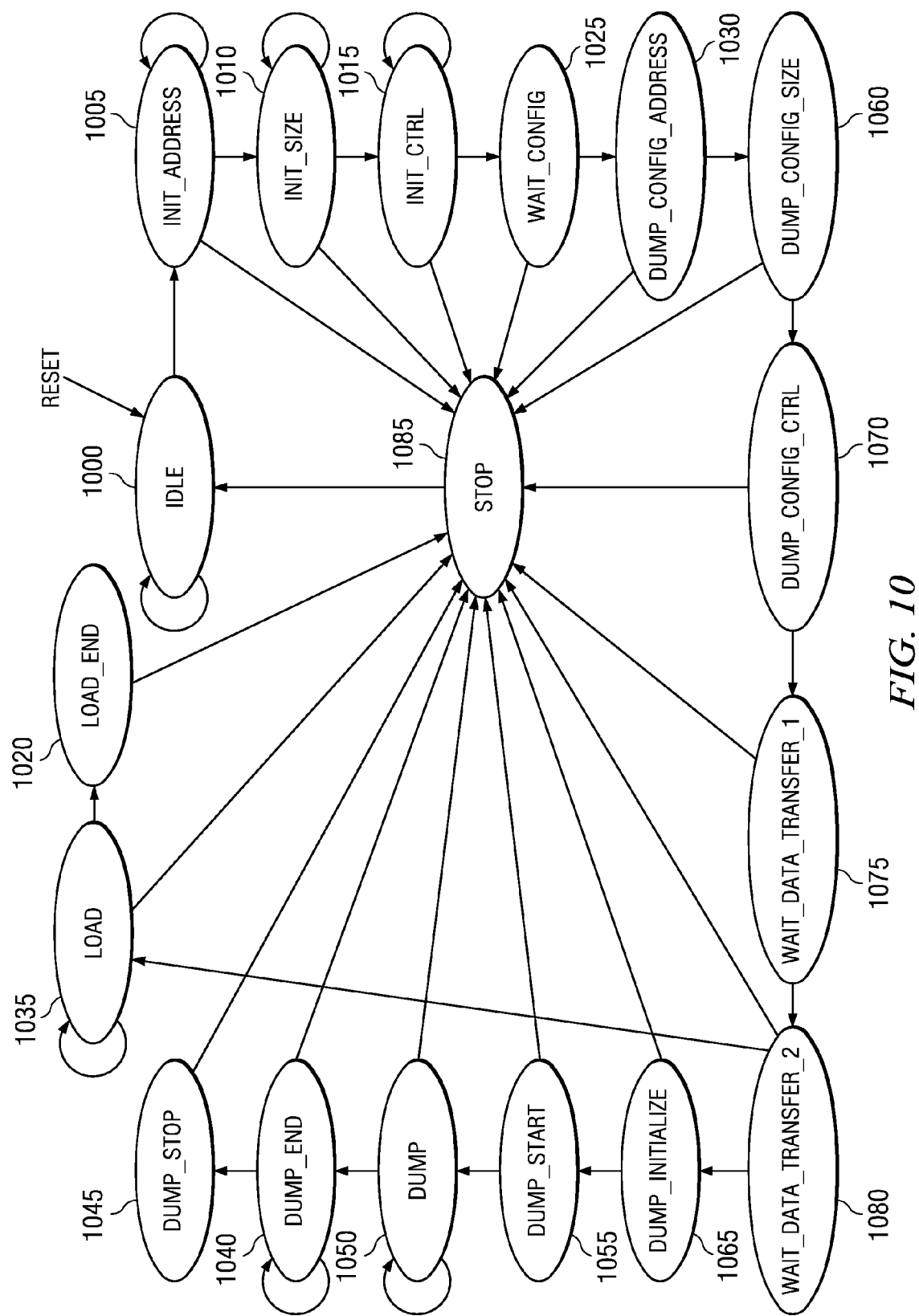
FIG. 10, in accordance with some embodiments of the invention, shows state diagram in DMLED test module for load phase and dump phase.

As shown in FIG. 10, the state machine described in detail below in DMLED test module 110 translates the data to/from the VLCT 210 and memory 130 (see FIGS. 2-5). Thus, DMLED test module 110 is used for loading or dumping any data or instructions to/from memory 130. The state machine in the DMLED test module regulates the data flow during load or dump. The DMLED test module eliminates need for a processor to load the test case into memory and transfer the results from memory to VLCT. Thus, creation of Test Descriptor Language (TDL) files for facilitating functional test cases at the operational clock rate of the processor is greatly simplified.

Figure 2:
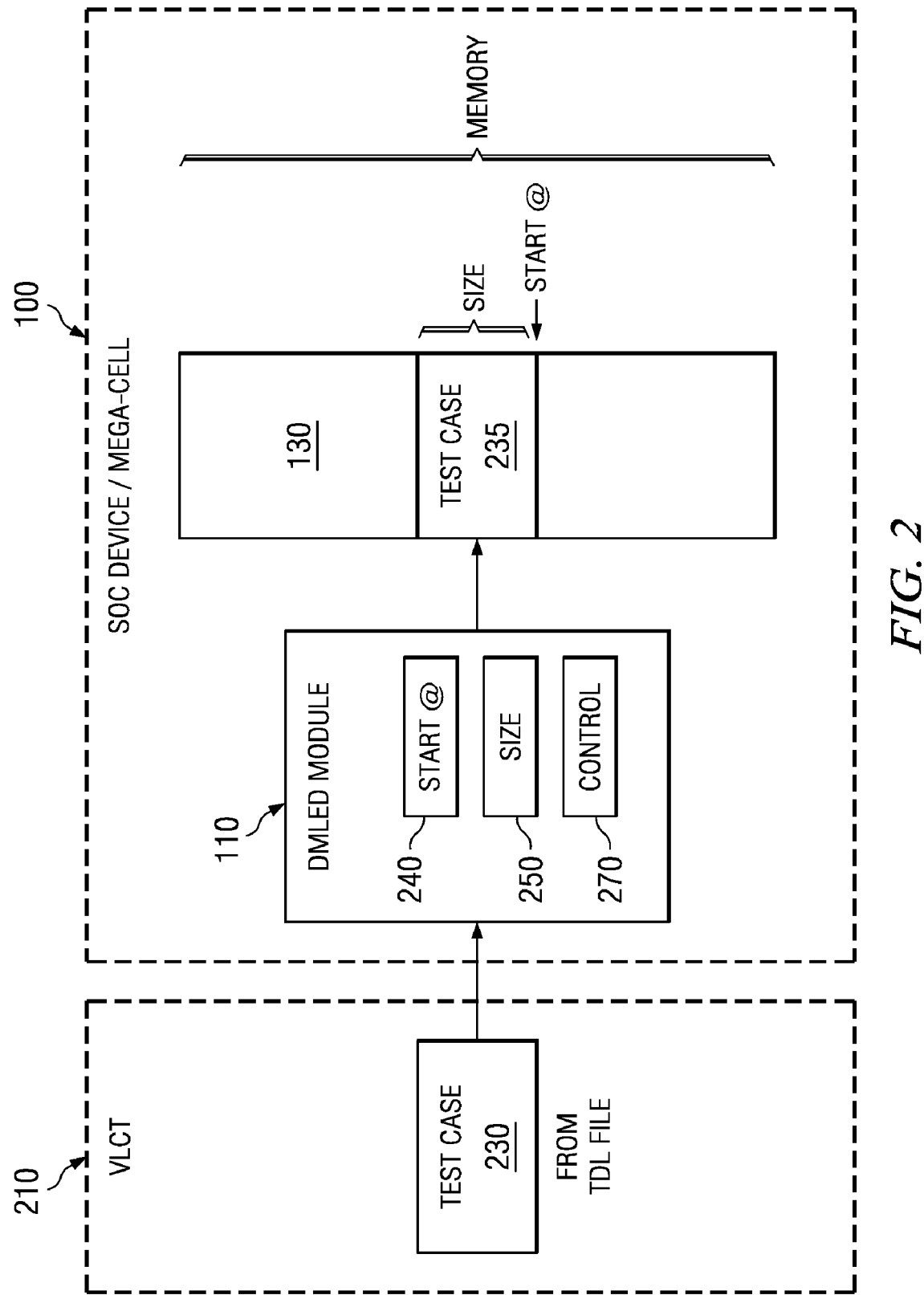
FIG. 2 shows a Very Low Cost Tester (VLCT) loading test case code to DMLED test module and memory.
Figure 3:
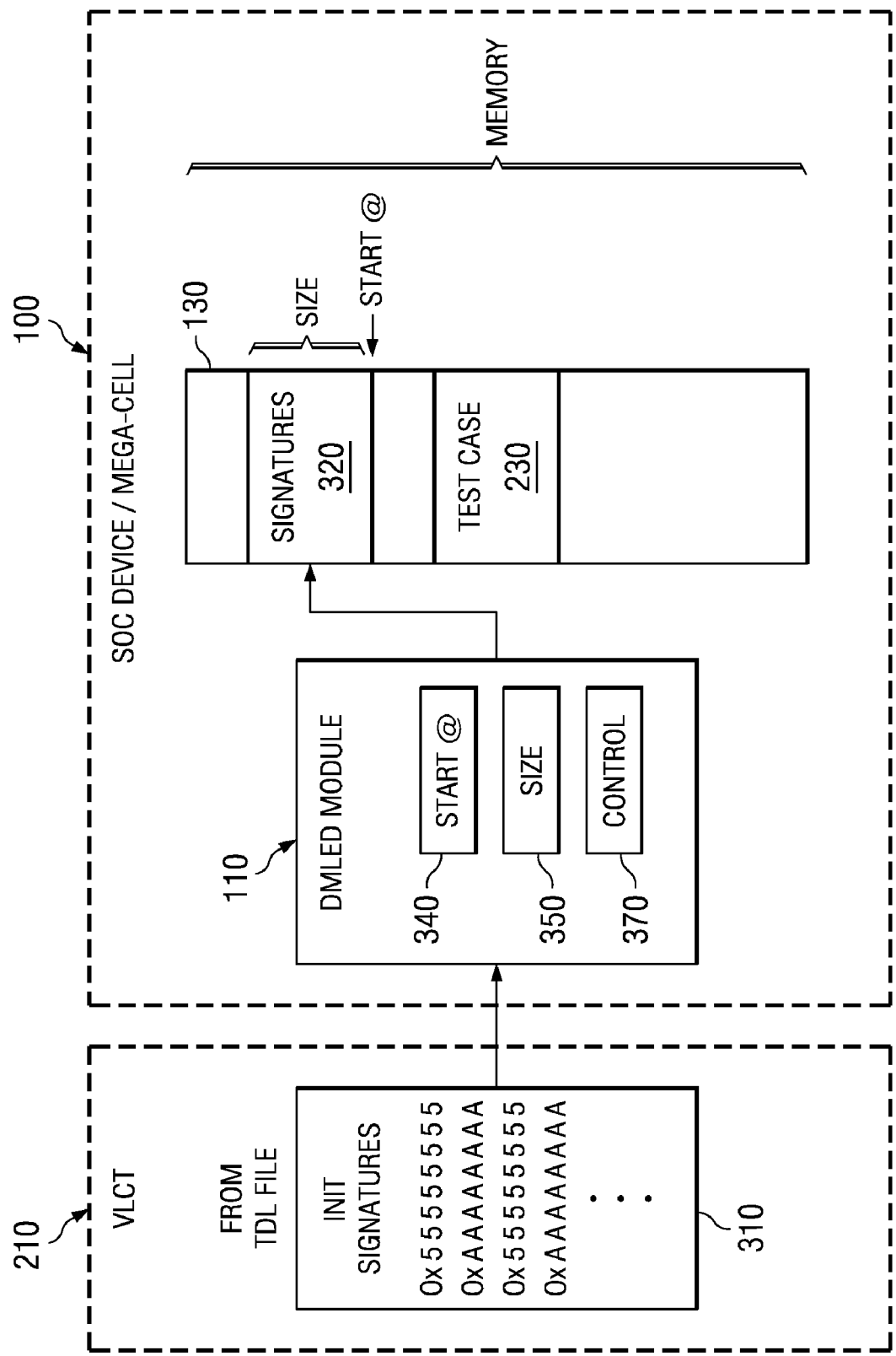
FIG. 3 shows Very Low Cost Tester (VLCT) loading initialization signatures to DMLED test module and signature section of memory.

In FIG. 2 and FIG. 3, at the beginning of each test sequence, the DMLED test module receives addresses for memory 130 that are the starting address 240 of a test case code section and starting address 340 of a signature section shown in FIG. 3. The signature section stores initialization signatures 310 before execution of test case code and result signatures after execution of test case code. The DMLED test module also receives test case code size parameter 250 and signature size parameter 350 that is the size in memory 130 of the test case code section or signature section, respectively. Control parameters 270 and 370 for controlling length of tests and wait states are also sent to the DMLED test module. Test module 110 does not execute software or machine code. The DMLED test module loads test case code and signatures to memory 130 and dumps the resulting signatures after execution of the test case code by the processor from memory 130 to the VLCT 210.

As shown in FIG. 1, the DMLED test module 110 includes input pins dmled_clk 165, dmled_en 180, dmled_load_n-dump 175, dmled_resetn 170, and dmled_system_en 125. The DMLED test module also includes input/output pins dmled_data[15:0] and output pin dmled_status. In some embodiments of the invention as shown in FIG. 1, DMLED test module dmled_data[15:0] pins are 16 bits and memory 130 is 32-bit wide data bus. In some other embodiments, the data bus in DMLED test module 110 and memory 130 may either or both be 16 bits, 32 bits, 64 bits, $2^n$ bits, and so on.

Figure 4:
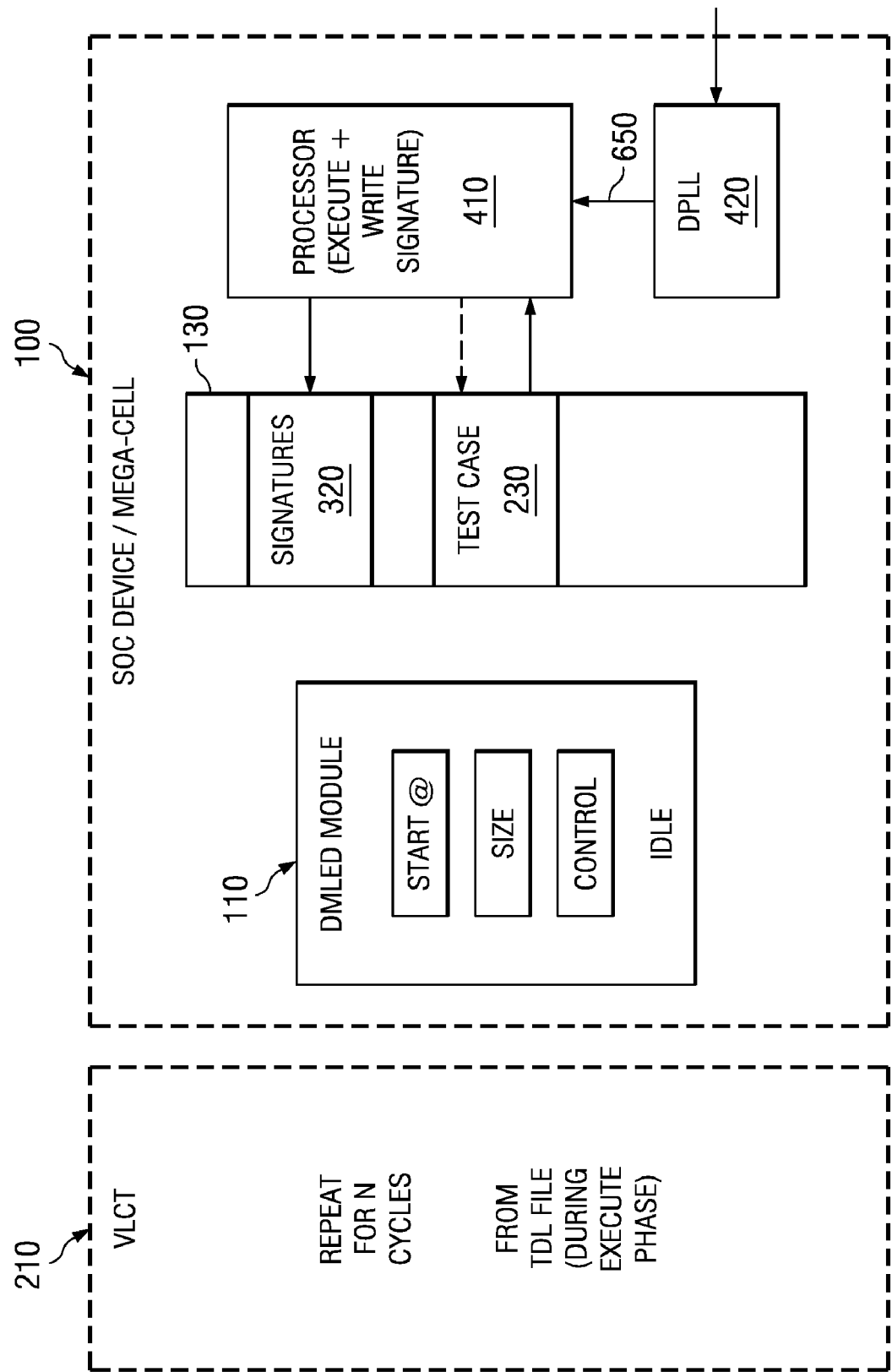
FIG. 4 shows a processor executing the test case and writing signatures to memory.

DMLED test module 110 is located in the SOC/Mega-cell and, like MBIST controller 150, connects through multiplexer 140 to memory 130. Thus, as shown in FIG. 1 and FIG. 4 and described in more detail below, during functional operation as the processor in the SOC executes, connection of the DMLED test module 110 through multiplexer 140 to memory 130 does not cause any timing delays along functional path.

DMLED test module 110 as shown in FIG. 1 includes a separate test module clock signal received at dmled_clk input pin 165 that is not dependent on the digital phase locked loop (DPLL) clock input from the VLCT (not shown in FIG. 1 or FIG. 4) or the DPLL clock 420 (FIG. 4) that outputs DPLL signal to processor 410 inside SOC 100. In accordance with some embodiments of the invention, the dmled_clk is independent of the DPLL clock.

Referring to FIGS. 2-5, SOC 100 including DMLED test module is shown in different phases of operation. FIG. 2 shows VLCT 210 loading test case code 230 from a Test Descriptor Language (TDL) file to DMLED test module 110. As described above, the VLCT 210 loads the test case code start address 240, size of test case code 250 and control parameters 270 into DMLED test module 110. The DMLED test module 110 loads the test case code 230 to memory 130 starting at start address 240 in test case code section 235.

In FIG. 3, VLCT 210 transfers initialization signatures 310 from the TDL file to DMLED test module 110. VLCT 210 loads the signatures start address 340, size of signatures 350 and control parameters 370 into DMLED test module 110. The DMLED test module 110 loads the initialization signatures 310 to memory 130 starting at start address 340. The initialization signatures 310 may be a unique numerical pattern such as hexadecimal number 0x55555555 and 0xAAAAAAAA as shown 310 in FIG. 3. The unique numerical pattern may be loaded into the section of memory 130 holding signatures 320 starting at start address 340. Use of a unique numerical pattern in signatures section 320 of memory 130 for initialization assists in determination of proper test case execution and write of the result signatures. Improper execution of the test case may cause none or only part of the test result signatures to be written to memory signature section 320. Furthermore, if multiple test cases are to be executed in sequence (e.g. test cases with VDD remaining same but the frequency varies for each test case) initializing the signatures to a unique numerical pattern after executing each test case insures that the correct results are dumped after execution from the present test case rather than a previous test case.

FIG. 4 shows the DMLED test module 110 in IDLE and unused as the test case executes in processor 410. Digital Phase Lock Loop (DPLL) 420 generates a clock signal at functional processor clock speed to simulate actual operation of processor 410. As the test case executes in processor 410, multiplexer 140 (not shown in FIG. 4) connects memory 130 directly to functional address, data and control buses. Functional address, data and control buses may be signals internal to SOC from processor 410 to memory 130 as shown in FIG. 4. Thus, the processor 410 simulates normal execution of the test case from internal memory 130.

Figure 5:
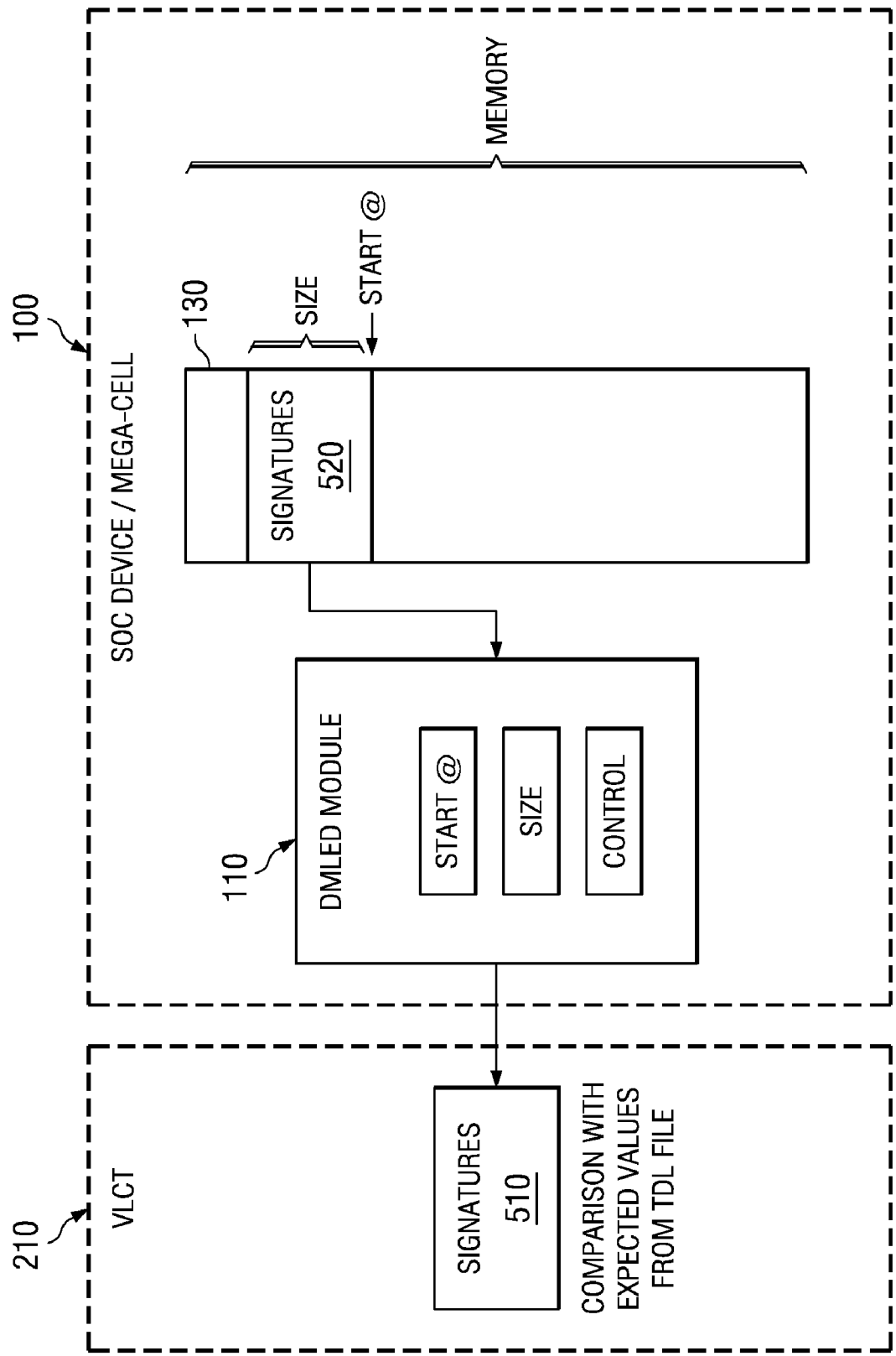
FIG. 5 shows the DMLED test module receiving signatures and dumping signatures to the VLCT tester.

Turning now to FIG. 5, after execution of each test case, DMLED test module 110 dumps the result signatures 520 from memory 130 to VLCT 210 generated by execution of the test case by processor 410. The dump of the signatures occurs at the DMLED Clk 660 clock rate (FIG. 6) at input pin dmled_clk 165 (FIG. 1) while the DPLL output clock 420 continues to generate a clock signal 650 for processor 410 and the processor 410 is waiting for the next test case load. During execution of the test case, processor 410 writes result signatures 520 into memory 130. The signatures 520 may include PSA (Parallel Signature Analyser) results, results from executing test case code, intermediate results of computation, and so on. PSA may be a shift register that is used to store signature values from signal buses during execution of a test case. PSA results may then be dumped to the VLCT 210. VLCT 210 compares the signatures 520 with expected signature values 510 from TDL file to determine if the integrated circuit passed the functional test.

Figure 6:
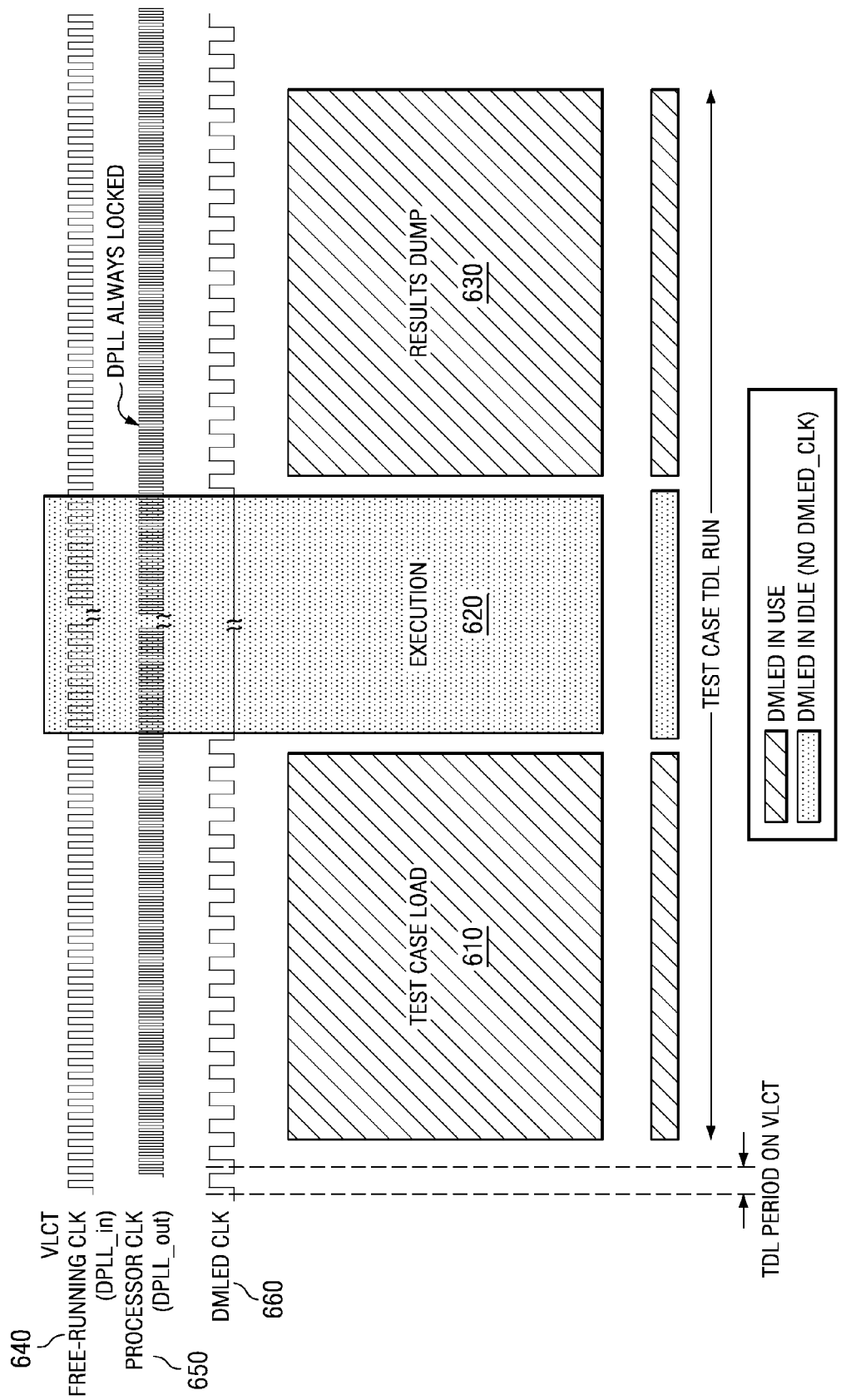
FIG. 6 shows clock signals during the load, execute and dump phases.

FIG. 6 shows clock signals during the load, execute and dump phases as described above with reference to FIGS. 2-5. VLCT 210 includes a clock signal DPLL_in 640 that is asynchronous to DPLL clock signal DPLL_out 650 generated by DPLL 420. As described above, the DMLED includes a dedicated clock DMLED Clk signal 660 input to DMLED module 110 at dmled_clk input pin 165. DMLED CLK signal 660 is asynchronous from DPLL clock signal DPLL_out 650. Because DMLED Clk signal and DPLL_out are asynchronous and independent, the DPLL_out signal continues uninterrupted as each test case is loaded 610, executed 620, and results dumped 630. Multiple test cases may be concatenated and the DPLL_out signal locked for continuous operation during load-execute dump, thus saving the time for relock of DPLL_out signal. Because DMLED Clk signal and DPLL_out are independent, idle of DMLED test module 110 during execution of test cases by processor 410 can occur without interfering with DPLL_out signal.

Figure 7:
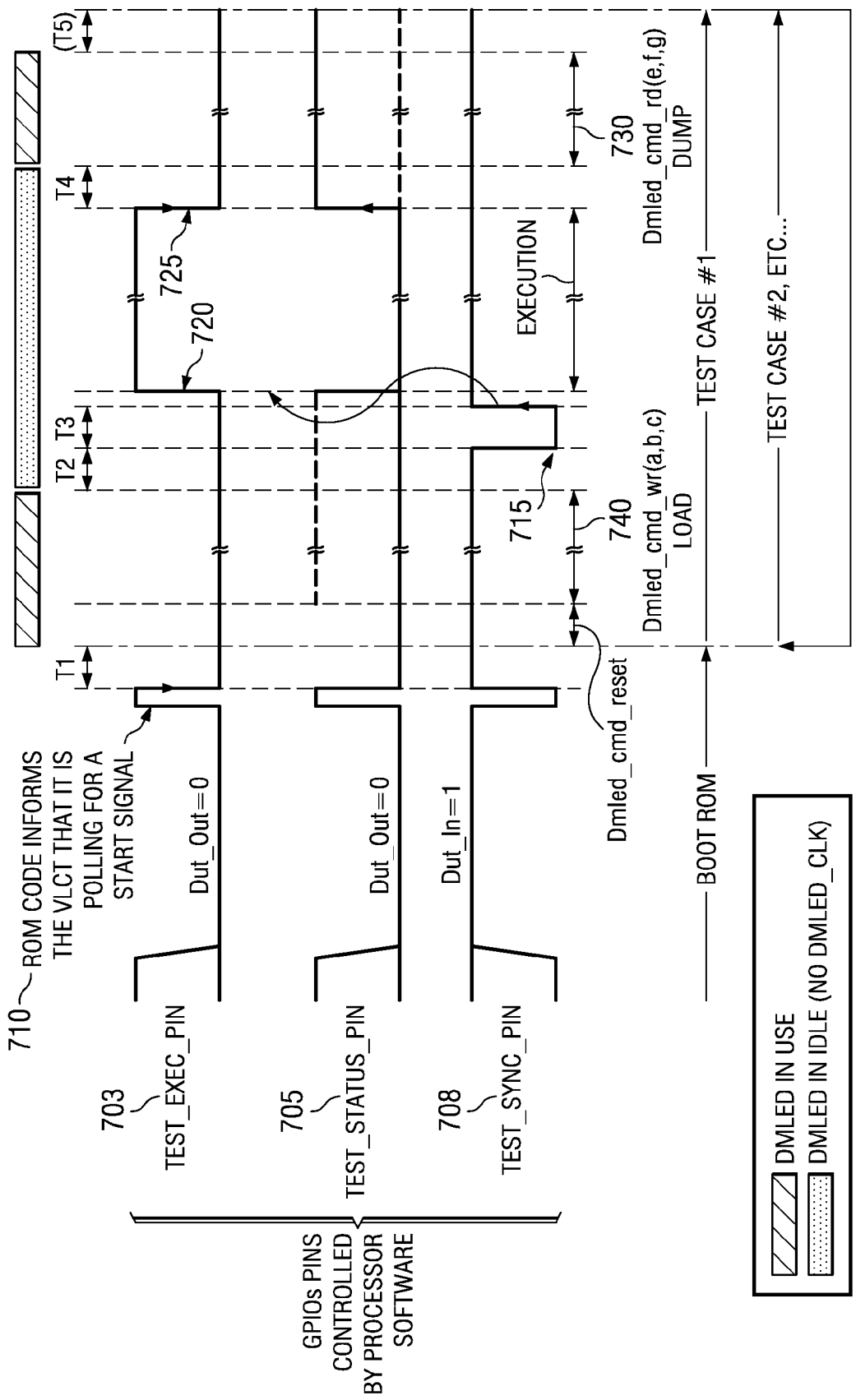
FIG. 7 shows timing signals during execution of test cases.

Turning now to FIG. 7, timing signals during execution of test cases shows interaction of processor 410, DMLED test module 110, and boot ROM (not shown in Figures) executing on processor 410 of SOC/mega-cell 100. Test_exec_pin 703, Test_status_pin 705, and Test_sync_pin 708 are general purpose input/output (GPIO) pins of SOC 100 that are controlled by firmware and software executing on processor 410. The boot ROM includes firmware code that, upon execution, informs the VLCT by pulse 710 on Test_Exec_Pin that it is waiting for a signal to start execution of the next test case. The VLCT responds by performing a reset Dmled_cmd_reset using dmled_resetn pin 170 (FIG. 1) of the DMLED test module and writing start addresses of test case code section and signature section, test case code section size and signature section size parameters, and control parameters to DMLED test module. The DMLED test module loads the initialization signatures and test case to memory 130 Dmled_cmd_wr(a, b, c) 740. Next, the boot ROM sets Test_sync_pin low 715 that wakes-up processor 410 to start execution of the test case. Processor 410 begins execution of the test case at the start address in memory where the test case has been loaded. During execution of the test case, Test_exec_pin 703 goes high 720 and remains high until the test case has completed execution when Test_exec_pin 703 goes low 725. At time 725, when the test case has completed execution, Test_status_pin is set high by the processor executing the test case if the test was passed or low if the test case failed. The DMLED test module then performs a dump Dmled_cmd_rd (e, f, g) 730 of the contents of memory 130 to VLCT 210 including signatures section 520 containing the test results. After receiving the results signatures 510 for the test case, the VLCT performs a reset Dmled_cmd_reset on pin dmled_resetn 170 (FIG. 1) of DMLED test module 110 to start execution of the next test case.

As shown in FIG. 1, in accordance with some embodiments of the invention, security enable pin dmled_system_en 125 output from Security controller 120 couples to DMLED test module 110 and prevents improper access to the contents of memory 130. As the DMLED test module may be used to dump out the full contents of memory coupled to it, critical data stored on the memory during normal function mode of SOC device/mega-cell 100 may be compromised. Thus, in some embodiments of the invention, to prevent such unauthorized access, dmled_system_en 125 must be asserted and dmled_en pin 180 must also be asserted to permit use of the DMLED test module 110. In some embodiments of the invention, boot ROM firmware code executing on processor 410 "cleans" the memory 130 by making sure the memory contains no critical data and then asserts dmled_system_en 125 by writing to an internal register. After dmled_system_en 125 is asserted, the DMLED test module is then accessible and usable for testing of SOC/mega-cell 100.

Figure 8:
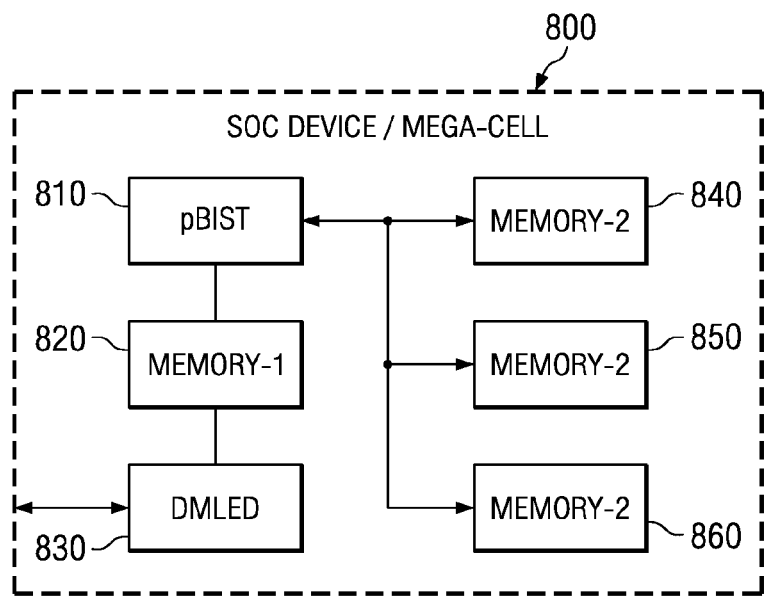
FIG. 8 shows a schematic diagram of test module coupled to programmable BIST (PBIST) to test memories in accordance with some preferred embodiments of the invention.

Turning now to FIG. 8, a schematic diagram of DMLED test module 830 coupled to programmable BIST (PBIST) 810 to test memories 840, 850, 860 in accordance with some preferred embodiments of the invention is shown. SOC/mega-cell 800 includes pBIST 810 coupled to Memory-1 module 820 and multiple Memory-2 modules 840, 850, and 860. In some embodiments of the invention, Memory-1 and Memory-2 modules may be Random Access Memory (RAM). Memory-1 module 820 couples to DMLED test module 830 and DMLED test module 830 couples to VLCT (not shown in FIG. 8). PBIST includes a programmable algorithm that may be stored on Memory-1 to perform tests on Memory-2. Thus, Memory-1 820 may be a small memory that contains the software code incorporating the programmable algorithm to test Memory-2 modules 840, 850, and 860. DMLED test module 830 may be used to load from VLCT the programmable algorithm into Memory-1 820. As described above, the DMLED test module 830 would allow execution by PBIST of the programmable algorithm on Memory-1 and dump the results to VLCT.

Figure 9:
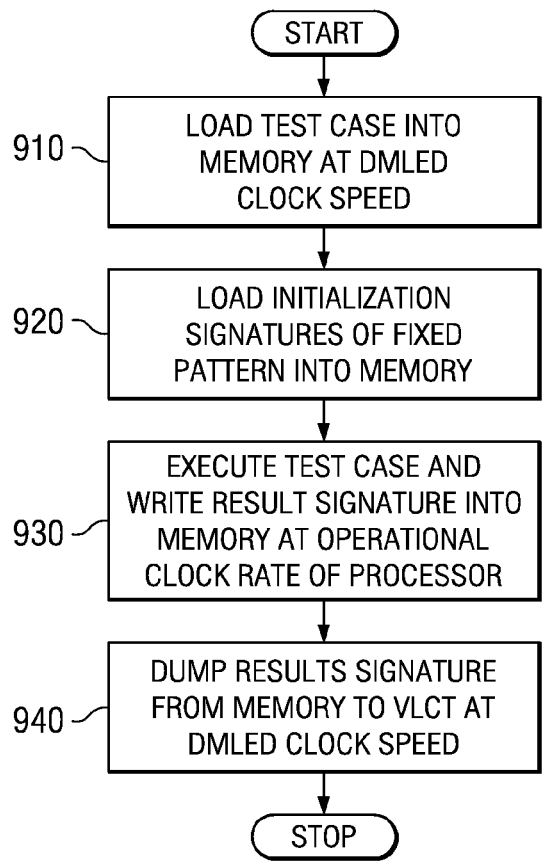
FIG. 9 shows, in accordance with some embodiments of the invention, a flowchart of test circuitry shown in FIG. 1 in operation.

FIG. 9 shows, in accordance with some embodiments of the invention, a flowchart of operation of test circuitry shown in FIGS. 1-5. In block 910, a test case is loaded into memory 130 by DMLED test module 110 at DMLED Clk speed. Next, in block 920, DMLED test module 110 loads initialization signatures of fixed pattern into memory 130. In block 930, processor 410 executes the test case and writes the result signatures into memory at operational clock rate of the processor. The DMLED test module dumps the result signatures from memory 130 to the VLCT at DMLED Clk speed in block 940.

Referring now to FIG. 10, in accordance with some embodiments of the invention, a finite state machine (FSM) in the DMLED test module for load phase and dump phase is shown. FIG. 10 will be described referring back to FIGS. 1-5 and FIG. 7. In accordance with some embodiments of the invention, in a first iteration of FSM, load of the test case 230 from VLCT 210 to memory 130 as shown in FIG. 2 may be caused by FSM in DMLED test module 110 transitioning through states IDLE 1000, INIT_ADDRESS 1005, INIT_ SIZE 1010, INIT_CTRL 1015, WAIT_CONFIG 1025, DUMP_CONFIG_ADDRESS 1030, DUMP_ CONFIG_SIZE 1060, DUMP_CONFIG_CTRL 1070, WAIT_DATA_TRANSFER_1 1075, WAIT_DATA_TRANSFER_2, LOAD 1035, LOAD_END 1020, STOP 1085, and IDLE 1000 controlled by signals from VLCT at input of DMLED test module 110 (FIG. 1) and firmware/software executing on processor 410 (FIG. 7). In a second iteration of FSM shown in FIG. 10 that is in DMLED test module 110, load of initialization signatures 310 from VLCT to signature section 320 in memory 130 as shown in FIG. 3 may be caused by transitioning through states IDLE 1000, INIT_ADDRESS 1005, INIT_SIZE 1010, INIT_CTRL 1015, WAIT_CONFIG 1025, DUMP_CONFIG_ADDRESS 1030, DUMP_CONFIG_SIZE 1060, DUMP_CONFIG_CTRL 1070, WAIT_DATA_TRANSFER_1 1075, WAIT_DATA_TRANSFER_2, LOAD 1035, LOAD_END 1020, STOP 1085, and IDLE 1000 controlled by signals from VLCT at input of DMLED test module 110 (FIG. 1) and firmware/software executing on processor 410 (FIG. 7). In a third iteration of FSM shown in FIG. 10 that is in DMLED test module 110, dump of results signature in signature section 520 of memory 130 after execution phase to VLCT 210 as shown in FIG. 5 may be caused by transitioning through states IDLE 1000, INIT_ADDRESS 1005, INIT_SIZE 1010, INIT_CTRL 1015, WAIT_CONFIG 1025, DUMP_CONFIG_ADDRESS 1030, DUMP_CONFIG_SIZE 1060, DUMP_CONFIG_CTRL 1070, WAIT_DATA_TRANSFER_1 1075, WAIT_DATA_TRANSFER_2, DUMP_INITIALIZE 1065, DUMP_START 1055, DUMP 1050, DUMP_END 1040, DUMP_STOP 1045, STOP 1085, and IDLE 1000 controlled by signals from VLCT at input of DMLED test module 110 (FIG. 1) and firmware/software executing on processor 410 (FIG. 7). Detailed description of each state and its transitions for the iterations described are given below.

DMLED test module 110 may be placed into IDLE state 1000 by reset signal Dmled_cmd_reset (FIG. 7) at input pin dmled_resetn 170 (FIG. 1) from VLCT 210. DMLED test module 110 remains in Idle state until the dmled_en input 180 (FIG. 1) is asserted causing DMLED test module to transition to INIT_ADDRESS state 1005. In INIT_ADDRESS state 1005, VLCT writes start address of test case code section in iteration one or signature section in iterations two or three to DMLED test module 110. After completion of writing addresses in INIT_ADDRESS state 1005, DMLED test module transitions to INIT_SIZE state 1010. In INIT_SIZE state, VLCT writes size parameter of test case code section if in iteration one or size parameter of signature section if in iterations two or three to DMLED test module 110 causing transition to INIT_CTRL state 1015. In INIT_CNTRL state 1015, VLCT writes control parameters for loading test case and wait state programming to DMLED test module 110 in first iteration of FSM. In the second iteration of FSM shown in FIG. 10, in INIT_CTRL state 1015, VLCT writes control parameters for loading initialization signatures 310 and wait state programming to DMLED test module 110. In the third iteration of FSM shown in FIG. 10, in INIT_CTRL state 1015, VLCT writes control parameters for dumping results signatures 520 and wait state programming to DMLED test module 110. After completion of INIT_CNTRL state, a single cycle WAIT_CONFIG state 1025 allows signals to settle and prepare for memory or VLCT access. After WAIT_CONFIG state, the next three states DUMP_CONFIG_ADDRESS 1030, DUMP_CONFIG_SIZE 1060, and DUMP_CONFIG_CTRL 1070 of DMLED test module transfer address, size, and control parameters back to VLCT 210 to confirm the values and verify proper communication in all three iterations. DMLED test module 110 transitions to WAIT_DATA_TRANSFER_1 state 1075 and WAIT_DATA_TRANSFER_2 state 1080 to allow signals to settle in all three iterations.

DMLED test module transitions to LOAD state 1035 from WAIT_DATA_TRANSFER_2 state if dmled_load_ndump input 175 is asserted. As described above, DMLED test module enters LOAD state 135 in iteration one (FIG. 2) or iteration two (FIG. 3). In LOAD state 1035, DMLED test module loads the test case code section if in iteration one or initialization signatures if in iteration two to memory 130 at respective start addresses. DMLED test module 110 in LOAD_END state 1020 indicates that memory 130 contains test case code section 230/initialization signatures 310 that will be executed by processor 410 to perform functional tests. DMLED test module from LOAD_END state transitions to STOP state in the next clock cycle. STOP state 1085 may be also entered from any state if dmled_en input 180 (FIG. 1) of DMLED test module is deasserted. In the next clock cycle the DMLED test module goes to IDLE state 1000.

FSM shown in FIG. 10 restarts from IDLE state 1000 for Dump of memory 130 to VLCT 210 as shown in FIG. 5 and described above for state transitions in iteration three. In WAIT_DATA_TRANSFER_2 state, DMLED test module transitions to DUMP_INITIALIZE state 1065 if dmled_load_ndump input 175 (FIG. 1) is not asserted. DMLED test module 110 performs a dump 730 of the contents of memory 130 to VLCT 210 including signatures in signatures section 520 containing the test results in DUMP_INITIALIZE state 1065, DUMP_START state 1055, DUMP state 1050, DUMP_END state 1040, and DUMP_STOP state 1045. In some embodiments of the invention each state requires multiple cycles to dump the test results from memory 130 to VLCT 210. DMLED test module from DUMP_STOP state transitions to STOP state in the next clock cycle. In the next clock cycle, the DMLED test module goes to IDLE state 1000. After receiving the contents of memory 130 for the test case, the VLCT performs a reset Dmled_cmd_reset on input pin dmled_resetn 170 (FIG. 1) of DMLED test module to start execution of the next test case and FSM in DMLED test module restarts from IDLE state 1000.

While the present invention has been described with respect to a limited number of embodiments, those skilled in the art will appreciate numerous modifications and variations therefrom. Thus, for example, other embodiments of the FSM shown in FIG. 10 for DMLED test module load phase and dump phase may be possible. It is intended that the appended claims cover all such modifications and variations as fall within the true spirit and scope of this present invention.

What is claimed is:

1. A method of testing an integrated circuits circuit that includes a processor and an integrated test module, the method comprising:
   receiving, from an external testing unit, at the integrated test module (ITM), a test case for the processor;
   in response to receiving the test case from the external testing unit at the integrated test module, loading the test case into random access memory, with the integrated test module operating at an ITM clock rate when loading the test case into the random access memory;
   receiving, from the external testing unit, at the integrated test module, an initialization signature for the random access memory;
   in response to receiving the initialization signature from the external testing unit at the integrated test module, loading the initialization signature into a signature section of the random access memory, with the integrated test module operating at the ITM clock rate when loading the initialization signature into the random access memory;
   executing the test case on the processor, at a processor clock rate, wherein the processor clock rate is independent of the ITM clock rate, and wherein the processor, in response to executing the test case, writes a result signature to the signature section of the random access memory;
   with the integrated test module, reading the result signature from the signature section of the random access memory; and
   sending the result signature from the integrated test module to the external testing unit.

2. The method of claim 1, wherein the operation of executing the test case comprises causing the processor to execute a functional test that generates the result signature.

3. The method of claim 1, wherein the integrated test module operates at the ITM clock rate when sending the result signature to the external testing unit.

4. The method of claim 1, wherein the test module receives a first clock signal and the processor receives a second clock signal.

5. The method of claim 4, wherein the first clock signal and second clock signal are asynchronous and independent.

6. The method of claim 4, wherein:
   the ITM clock rate is based on the first clock signal;
   the processor clock rate is based on the second clock signal; and
   the processor executes the test case at functional processor clock speed to test operation of the processor at normal operating speed.

7. An integrated circuit, comprising:
   an integrated test module (ITM) operable to communicate with random access memory and with an external testing unit;
   a processor operable to communicate with the random access memory;
   a data interface in the integrated test module, the data interface to receive a test case for the processor from the external testing unit and to receive an initialization signature for the random access memory from the external testing unit; and
   control logic in the integrated test module, wherein the control logic causes the integrated test module to perform operations comprising:
      in response to receiving the test case from the external testing unit, loading the test case from into random access memory while operating at an ITM clock rate;
      in response to receiving the initialization signature from the external testing unit, loading the initialization signature into a signature section of the random access memory, while operating at the ITM clock rate;
      causing the processor to execute the test case at a processor clock rate, wherein the processor clock rate is independent of the ITM clock rate, and wherein the processor, in response to executing the test case, writes a result signature to the signature section of the random access memory;
      reading the result signature from the signature section of the random access memory; and
      sending the result signature from the integrated test module to the external testing unit.

8. The integrated circuit of claim 7, further comprising a security controller operably coupled to the integrated test module, said security controller configurable to prevent the integrated test module from accessing the random access memory.

9. The integrated circuit of claim 8, wherein the security controller is operably coupled to the processor, said processor operable to clean the random access memory and, after cleaning the memory, to configure the security controller to allow the integrated test module access to the random access memory.

10. The integrated circuit of claim 7, further comprising:
a multiplexer operably coupled to the test module, said multiplexer comprising an output; and
a test input for the random access memory;
wherein the random access memory test input connects to the output of the multiplexer; and
wherein said multiplexer, integrated test module, random access memory and processor are configured to not cause timing delays along functional paths between the processor and the random access memory.

11. The integrated circuit of claim 7, wherein:
the integrated test module comprises a clock interface to receive a first clock signal to set the ITM clock rate; and
the processor comprises a clock interface to receive a second clock signal to set the processor clock rate.

12. The integrated circuit of claim 11, wherein the first clock signal and the second clock signal are asynchronous and independent.

13. The integrated circuit of claim 11, wherein the ITM clock rate and the processor clock rate are asynchronous and independent.

14. The integrated circuit of claim 7, said processor executing the test case and writing the result signature into the random access memory at a normal operational clock rate for the processor.

15. The integrated circuit of claim 7, wherein said test case is a functional test.

16. An integrated circuit, comprising:
an integrated test module;
a first memory operably coupled to the integrated test module;
a programmable Built-In-Self-Test (PBIST) module operably coupled to the first memory;
one or more memories-under-test (MUT) operably coupled to the PBIST module;
a data interface in the integrated test module to receive a test case from an external testing unit;
control logic in the integrated test module configured to load a test case and an initialization signature from the external testing unit into the first memory to test the one or more MUTs; and
control logic in the PBIST module configured to execute the test case and write result signatures into the first memory;
wherein the control logic of the test module is also configured to send the result signatures from the first memory to the external testing unit.

17. The integrated circuit of claim 16, wherein:
the integrated test module comprises a clock interface to receive a first clock signal to set an ITM clock rate; and
the PBIST module comprises a clock interface to receive a second clock signal to set a PBIST clock rate.

18. The integrated circuit of claim 17, wherein the first clock signal and the second clock signal are asynchronous and independent.

19. The integrated circuit of claim 18, wherein the ITM clock rate and the PBIST clock rate are asynchronous and independent.

20. The integrated circuit of claim 16, wherein the PBIST module is operable to execute the test case and write the result signatures into the first memory at the PBIST module's operational clock rate.

21. An integrated circuit comprising:
a processor that operates at a processor clock rate, the processor operable to communicate with random access memory;
an integrated test module (ITM) that operates at an ITM clock rate, the integrated test module operable to communicate with the random access memory;
at least one interface in the integrated test module to enable communication with an external testing unit; and
control logic in the integrated test module to enable the integrated test module to perform operations comprising:
receiving test data from the external testing unit;
loading the test data received from the external testing unit into the random access memory while operating at the ITM clock rate;
after loading the test data, triggering the processor to process the test data at the processor clock rate, to generate result data, and to write the result data into the random access memory; and
after triggering the processor, reading the result data from the random access memory while operating at the ITM clock rate and sending the result data to the external testing unit;
wherein the processor clock rate is independent of the ITM clock rate.

22. An integrated circuit according to claim 21, wherein the at least one interface comprises:
a clock interface to receive, from the external testing unit, a clock signal to set the ITM clock rate; and
at least one data bus to receive the test data from the external testing unit and to send the result data to the external testing unit.

* * * * *